US008912663B1

(12) United States Patent
Lee et al.

(10) Patent No.: US 8,912,663 B1
(45) Date of Patent: Dec. 16, 2014

(54) EMBEDDED PACKAGE STRUCTURE AND METHOD FOR MANUFACTURING THEREOF

(71) Applicant: Delta Electronics, Inc., Taoyuan Hsien (TW)

(72) Inventors: Chia-Yen Lee, Taoyuan Hsien (TW); Hsin-Chang Tsai, Taoyuan Hsien (TW); Peng-Hsin Lee, Taoyuan Hsien (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 13/930,949

(22) Filed: Jun. 28, 2013

(51) Int. Cl.
*H01L 23/52* (2006.01)
*H01L 23/48* (2006.01)
*H01L 23/02* (2006.01)
*H01L 21/50* (2006.01)
*H01L 21/48* (2006.01)
*H01L 21/44* (2006.01)
*H01L 23/00* (2006.01)
*H01L 23/498* (2006.01)

(52) U.S. Cl.
CPC .......... *H01L 23/49866* (2013.01); *H01L 24/85* (2013.01)
USPC .................. 257/777; 257/686; 257/E25.027; 438/109; 438/121

(58) Field of Classification Search
CPC .......................... H01L 24/85; H01L 23/49866
USPC ........... 257/777, 686, E25.027; 438/109, 121
See application file for complete search history.

(56) References Cited

U.S. PATENT DOCUMENTS

| 7,807,512 | B2 * | 10/2010 | Lee et al. ...................... 438/127 |
| 7,902,674 | B2 | 3/2011 | Chang et al. |
| 7,989,944 | B2 | 8/2011 | Tuominen |
| 8,026,614 | B2 | 9/2011 | Kawabata et al. |
| 8,049,320 | B2 | 11/2011 | Harper et al. |
| 8,193,626 | B2 | 6/2012 | Park et al. |
| 8,238,113 | B2 * | 8/2012 | Iihola et al. ................... 361/761 |
| 8,399,993 | B2 * | 3/2013 | Yun .............................. 257/777 |
| 2012/0056312 | A1 * | 3/2012 | Pagaila et al. ................. 257/684 |

FOREIGN PATENT DOCUMENTS

JP 2009033185 2/2009

* cited by examiner

*Primary Examiner* — Luan C Thai
(74) *Attorney, Agent, or Firm* — Lowe Hauptman & Ham, LLP

(57) ABSTRACT

The disclosure provides an embedded package structure comprising a metal substrate, a chip module, an insulation material layer, and at least one patterned metal layer. The metal substrate has a first surface and a second surface. The chip module is disposed on the first surface of the metal substrate, and comprises at least two stacked chips being electrically connected to each. The insulation material layer covers the first surface of the metal substrate and the stacked chips and has an electrical interconnection formed therein. The patterned metal layer is positioned on the insulation material layer, and is electrically connected the chip module through the electrical interconnection. The method for manufacturing the embedded package structure also provides.

20 Claims, 7 Drawing Sheets

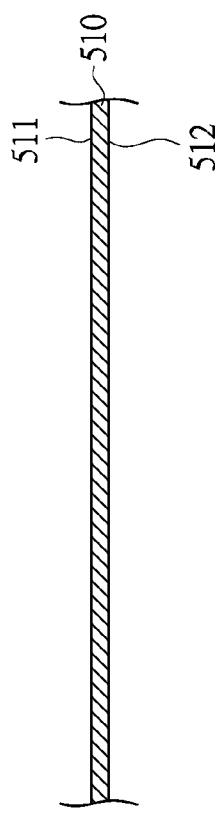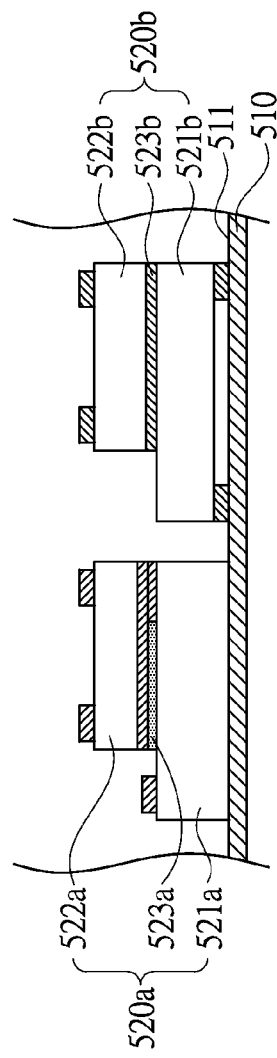

EMBEDDED PACKAGE STRUCTURE AND METHOD FOR MANUFACTURING THEREOF

BACKGROUND

1. Technical Field

The present disclosure relates to a package structure, and more particularly, to an embedded package structure.

2. Description of Related Art

A schematic sectional view of a conventional embedded package structure 100 is shown in FIG. 1, which is a single-chip embedded structure including chips 110, metal layers 120, an insulation material layer 130 and two passivation layers 140.

As shown In FIG. 1, the chips 110, the metal layers 120 and an insulation material layer 130 are sandwiched between the passivation layers 140. The chips 110 are individually positioned in the insulation material layer 130, and electrically connected to other chips 110 through the metal layers 120.

Since there are the numerous metal routing layers connecting to the chips, parasitic effects may appear in the embedded package structure to damage the chips. Besides, due to the numerous metal routing layers, the signal transmission distance in the single-chip embedded structure is so long that the intensity and quality of the signal may deteriorate. On the other way, the conventional embedded package structure having lots of chips inside always has a large size, which is unfavorable in design of a compact device.

Therefore, there is a need for an improved embedded package structure and a method for manufacturing the same, so as to solve the problems met in the art.

SUMMARY

The present disclosure provides an embedded package structure and a method for manufacturing thereof.

One embodiment of the present disclosure is to provide an embedded package structure. The embedded package structure comprises a metal substrate, a chip module, an insulation material layer, and at least one patterned metal layer.

The metal substrate has a first surface and a second surface.

The chip module is disposed on the first surface of the metal substrate, and comprises at least two stacked chips being electrically connected to each.

The insulation material layer covers the first surface of the metal substrate and the stacked chips, and has an electrically interconnection formed therein.

The patterned metal layer is positioned on the insulation material layer, and is electrically connected the chip module through the electrical interconnection.

According to one example of the present disclosure, the material of the metal substrate is copper (Cu) or Cu alloy.

According to one example of the present disclosure, the embedded package structure further comprises another chip module disposed on the first surface of the metal substrate.

According to one example of the present disclosure, at least one of the chips is of vertical type or lateral type.

According to one example of the present disclosure, the embedded package structure further comprises an adhesive or a solder positioned between the stacked chips.

According to one example of the present disclosure, the stacked chips are electrically connected to each other through a conductive layer.

According to one example of the present disclosure, the material of the insulation material layer includes ABF (Ajinomoto build-up film), BT (bismaleimide-triazine resin), PI (polyimide) or FR4 (glass-epoxy resin).

According to one example of the present disclosure, the material of the patterned metal layer is selected from the group consisting of copper (Cu), titanium (Ti), platinum (Pt), aluminum (Al), nickel (Ni), tungsten (W), gold (Au), zinc (Zn), tin (Sn), germanium (Ge), and a combination thereof.

According to one example of the present disclosure, the embedded package structure further comprises a first passivation layer covering the patterned metal layer.

According to one example of the present disclosure, the embedded package structure further comprises a second passivation layer covering the second surface of the metal substrate.

Another embodiment of the present disclosure is to provide a method for manufacturing an embedded package structure. The method comprises providing a metal substrate having a first surface and a second surface; forming a chip module disposed on the first surface of the metal substrate, wherein the chip module comprises at least two stacked chips electrically connected to each other; forming an insulation material layer covering the metal substrate and the stacked chips; forming a plurality of vias through the insulation material layers; and forming a patterned metal layer on the insulation material layer, wherein the vias electrically connect the chip module and the patterned metal layer.

According to one example of the present disclosure, the material of the metal substrate is copper (Cu) or Cu alloy.

According to one example of the present disclosure, the embedded package structure further includes an adhesive or a solder positioned between the stacked chips.

According to one example of the present disclosure, the material of the insulation material layer includes ABF (Ajinomoto build-up film), BT (bismaleimide-triazine resin), PI (polyimide) or FR4 (glass-epoxy resin).

According to one example of the present disclosure, forming the vias comprises laser drilling, dry etching or wet etching.

According to one example of the present disclosure, forming the patterned metal layer comprises metalization and etching process.

According to one example of the present disclosure, the metallization includes physical vapor deposition (PVD), chemical vapor deposition (CVD), atomic layer deposition (ALD) or metal organic chemical vapor deposition (MOCVD).

According to one example of the present disclosure, the etching process comprises dry etching or wet etching.

According to one example of the present disclosure, the embedded package structure further comprises a first passivation layer covering the patterned metal layer.

According to one example of the present disclosure, the embedded package structure further comprises a second passivation layer covering the second surface of the metal substrate.

According to one example of the present disclosure, the embedded package structure further comprises forming another chip module disposed on the first surface of the metal substrate.

According to one example of the present disclosure, forming the chip module on the first surface of the metal substrate comprises mounting a first chip on the first surface of the metal substrate; and stacking a second chip on the first chip, wherein the second chip is electrically connected with the first chip.

According to one example of the present disclosure, forming the chip module on the first surface of the metal substrate comprises providing the chip module comprising at least two stacked chips; and mounting the chip module on the first surface of the metal substrate.

BRIEF DESCRIPTION OF THE DRAWINGS

For a more complete understanding of the present invention, and the advantages thereof, reference is now made to the following descriptions taken in conjunction with the accompanying drawings, in which:

FIG. 5A to 5F are schematic sectional views of making an embedded package structure 500 according to one embodiment of the present disclosure.

DETAILED DESCRIPTION

Figure 1:
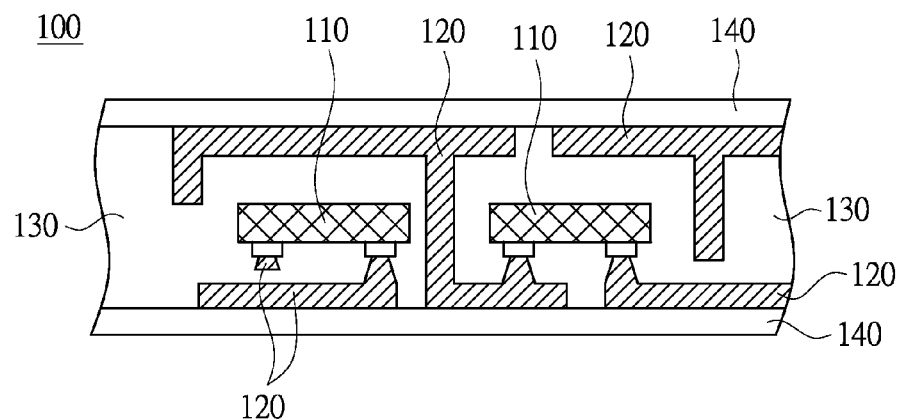
FIG. 1 is a schematic sectional view of a conventional embedded package structure 100.

The embodiments of the embedded package structure and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

Figure 2A:
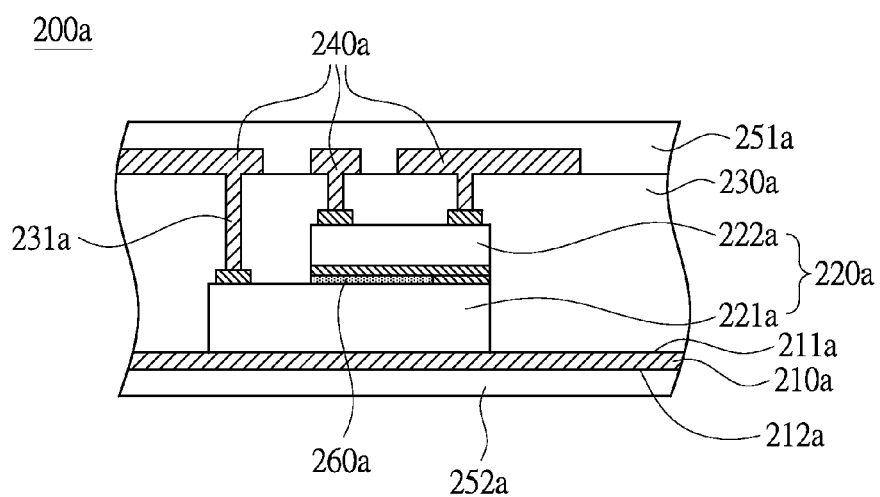
FIG. 2A is a schematic sectional view of an embedded package structure 200a according to one embodiment of the present disclosure.

FIG. 2A is a schematic sectional view of an embedded package structure 200a according to one embodiment of the present disclosure. In FIG. 2A, the embedded package structure 200a comprises a metal substrate 210a, a chip module 220a, an insulation material layer 230a, a patterned metal layer 240a, a first passivation layer 251a and a second passivation layer 252a.

The metal substrate 210a has a first surface 211a and a second surface 212a, and the chip module 220a is disposed on the first surface 211a of the metal substrate 210a. The chip module 220a comprises at least two chips vertically integrated and electrically connected to each other. As shown in FIG. 2A, the chip module 220a comprises two stacked chips 221a and 222a, and has a plurality of terminals. In an embodiment, at least one terminal of the chip module 220a is electrically connected to the metal substrate. According to one example of the present disclosure, the metal substrate 210a is a lead frame, and the material of the metal substrate 210a is copper (Cu) or Cu alloy.

According to one example of the present disclosure, at least one of the chips is of vertical type or lateral type. In FIG. 2A, both of the chips 221a and 222a are vertical type.

According to one example of the present disclosure, an adhesive layer or a solder 260a is positioned between the chips 221a and 222a, as shown in FIG. 2A.

According to one example of the present disclosure, the stacked chips are electrically connected to each other directly or through a conductive layer. In an embodiment, the chip 221a is directly electrically connected to the chip 222a.

The insulation material layer 230a has a plurality of vias 231a, and covers the first surface 211a of the metal substrate 210a and the chip module 220a. The patterned metal layer 240a is positioned on the insulation material layer 230a, and the vias 231a are electrically connected to at least one terminal of the chip module 220a and the patterned metal layer 240a.

According to one example of the present disclosure, the material of the insulation material layer includes ABF (Ajinomoto build-up film), BT (bismaleimide-triazine resin), PI (polyimide) or FR4 (glass-epoxy resin), but not to limit. In FIG. 2A, the insulation material layer 230a is made from ABF.

According to one example of the present disclosure, the material of the patterned metal layer is selected by the group of the copper (Cu), titanium (Ti), platinum (Pt), aluminum (Al), nickel (Ni), tungsten (W), gold (Au), zinc (Zn), tin (Sn), germanium (Ge), or a combination thereof. According to one example of the disclosure, the material of the vias 231a is same as the patterned metal layer 240a. According to another example of the disclosure, the material of the vias 231a is different to the patterned metal layer 240a. In FIG. 2A, the material of the patterned metal layer 240a is copper (Cu).

The first passivation layer 251a covers the patterned metal layer 240a. And the second passivation layer 252a covers the second surface 212a of the metal substrate 210a. According to one example of the present disclosure, the material of the first passivation layer is epoxy resins, silicon oxides (SiOx) or silicon nitrides (SiNx). According to one example of the present disclosure, the material of the second passivation layer is epoxy resins, silicon oxides (SiOx) or silicon nitrides (SiNx).

Figure 2B:
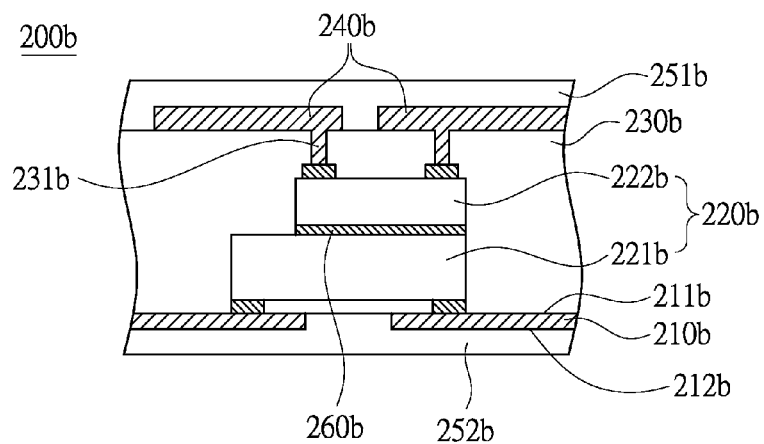
FIG. 2B is a schematic sectional view of an embedded package structure 200b according to one embodiment of the present disclosure.

FIG. 2B is a schematic sectional view of an embedded package structure 200b according to one embodiment of the present disclosure. In FIG. 2B, the embedded package structure 200b comprises a patterned metal substrate 210b, two stacked chips 221b and 222b, an insulation material layer 230b, a patterned metal layer 240b, a first passivation layer 251b and a second passivation layer 252b.

The patterned metal substrate 210b has a first surface 211b and a second surface 212b, and the chips 221b and 222b are stacked on the first surface 211b of the patterned metal substrate 210b. And the chip 221b is electrically connected to the chip 222b, which forms a chip module 220b. In which, the chip 221b is mounted onto the patterned metal substrate 210b in a flip-chip manner, and the chip 222b is stacked and electrically connected to the chip 221b. In FIG. 2B, the chip 221b is electrically connected to the chip 222b through a conductive layer 260b, wherein the conductive layer 260b is a solder.

The insulation material layer 230b has a plurality of vias 231b, and covers the first surface 211b of the patterned metal substrate 210b and the chip 222b. The patterned metal layer 240b is positioned on the insulation material layer 230b, and the vias 231b are electrically connected to the chip 222b and the patterned metal layer 240b.

The first passivation layer 251b covers the patterned metal layer 240b. And the second passivation layer 252b covers the second surface 212b of the patterned metal substrate 210b.

Figure 3:
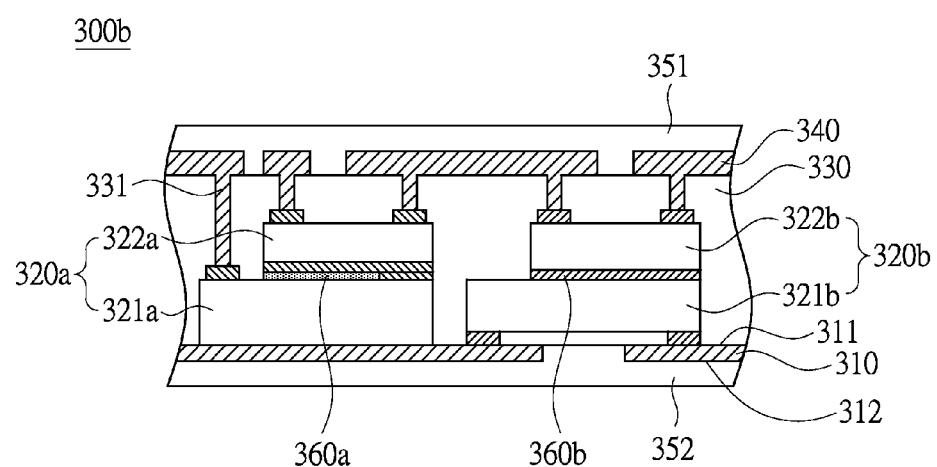
FIG. 3 is a schematic sectional view of an embedded package structure 300 according to one embodiment of the present disclosure.

FIG. 3 is a schematic sectional view of an embedded package structure 300b according to one embodiment of the present disclosure. In FIG. 3, the embedded package structure 300b comprises a patterned metal substrate 310, two chip modules 320a and 320b, an insulation material layer 330, a patterned metal layer 340, a first passivation layer 351 and a second passivation layer 352.

The patterned metal substrate 310 has a first surface 311 and a second surface 312, and the chip modules 320a and 320b are positioned on the first surface 311 of the patterned metal substrate 310. In which, the chip module 320a is made by the stacked chips 321a and 322a; and the chip module 320b is made by the stacked chips 321b and 322b.

In FIG. 3, an adhesive layer 360a is sandwiched between the stacked chips 321a and 322a of the chip module 320a. And the stacked chips 321a and 322a of the chip module 320a are directly electrically connected to each other; and the stacked chips 321b and 322b of the chip module 320b are electrically connected to each other through a conductive layer 360b.

The insulation material layer 330 has a plurality of vias 331, and covers the first surface 311 of the patterned metal substrate 310 and the chip modules 320a and 320b. The patterned metal layer 340 is positioned on the insulation material layer 330.

In FIG. 3, the vias 331 are electrically connected to the chip modules 320a and 320b and the patterned metal layer 340, wherein the chips 321a and 322a of the chip module 320a and the chip 322b of the chip module 320b are electrically connected to the patterned metal layer 340, and the chip 321b of the chip module 320b is electrically connected to the patterned metal substrate 310. And the chip 322a of the chip module 320a is electrically connected to the chip 322b of the chip module 320b through the patterned metal layer 340.

According to one example of the present disclosure, the chip module further comprises another chip disposed on the patterned metal substrate 310 and electrically connected to other chips, stacked chips, chip modules or a combination thereof through the patterned metal layer.

Figure 4:
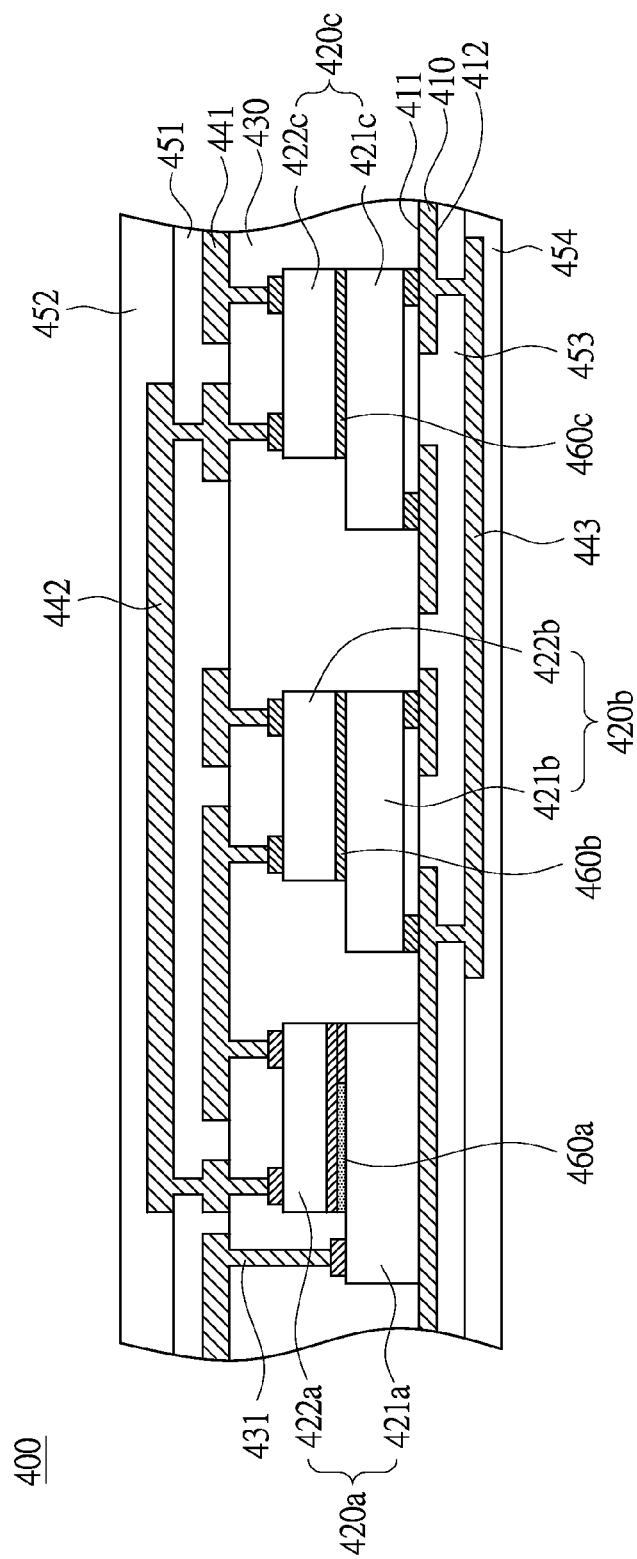
FIG. 4 is a schematic sectional view of an embedded package structure 400 according to one embodiment of the present disclosure.

FIG. 4 is a schematic sectional view of an embedded package structure 400 according to one embodiment of the present disclosure. In FIG. 4, the embedded package structure 400 comprises a patterned metal substrate 410, chip modules 420a, 420b and 420c, an insulation material layer 430, a first patterned metal layer 441, a second patterned metal layer 442, a third patterned metal layer 443, a first passivation layer 451, a second passivation layer 452, a third passivation layer 453 and a fourth passivation layer 454.

The patterned metal substrate 410 has a first surface 411 and a second surface 412, and the chip modules 420a, 420b and 420c are positioned on the first surface 411 of the patterned metal substrate 410. In which, the chip module 420a is made by the stacked chips 421a and 422a; the chip module 420b is made by the stacked chips 421b and 422b; and the chip module 420c is made by the stacked chips 421c and 422c.

In FIG. 4, an adhesive layer 460a is sandwiched between the stacked chips 421a and 422a of the chip module 420a. And the stacked chips 421a and 422a of the chip module 420a are directly electrically connected to each other. The stacked chips 421b and 422b of the chip module 420b are electrically connected to each other through a conductive layer 460b; and the stacked chips 421c and 422c of the chip module 420c are electrically connected to each other through a conductive layer 460c.

The insulation material layer 430 has a plurality of vias 431, and covers the first surface 411 of the patterned metal substrate 410 and the chip modules 420a, 420b and 420c. The first patterned metal layer 441, the first passivation layer 451, the second patterned metal layer 442 and the second passivation layer 452 are sequentially positioned on the insulation material layer 430.

In FIG. 4, the vias 431 are electrically connected to the chip modules 420a, 420b and 420c, and the first patterned metal layer 441. In which, the chips 421a and 422a of the chip module 420a, the chip 422b of the chip module 420b and the chip 422c of the chip module 420c are electrically connected to the first patterned metal layer 441. And the chip 421b of the chip module 420b and the chip 421c of the chip module 420c are flip chips electrically connected to the patterned metal substrate 410.

The chip 422a of the chip module 420a is electrically connected to the chip 422b of the chip module 420b through the first patterned metal layer 441. And the chip 422a of the chip module 420a is electrically connected to the chip 422c of the chip module 420c through the second patterned metal layer 442.

The third passivation layer 453, the third patterned metal layer 443 and the fourth passivation layer 454 are sequentially positioned on the second surface 412 of the patterned metal substrate 410. In which, the chip 421b of the chip module 420b is electrically connected to the chip 421c of the chip module 420c through the third patterned metal layer 443.

Figure 5C:
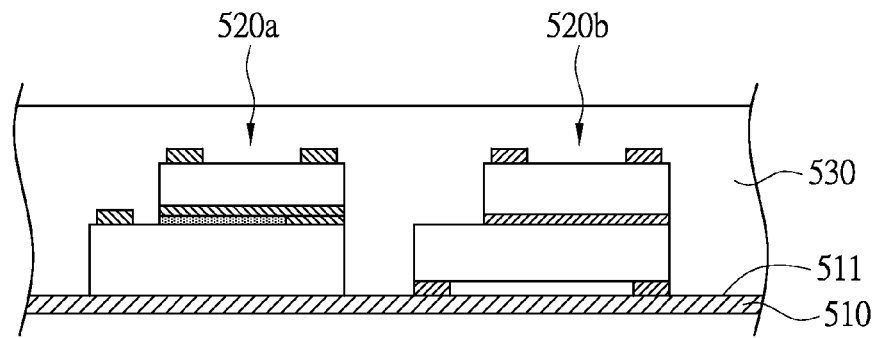

FIG. 5A to 5F are schematic sectional views of making an embedded package structure 500 according to one embodiment of the present disclosure. In FIG. 5A, a metal substrate 510 is provided, which has a first surface 511 and a second surface 512. According to one example of the present disclosure, the material of the metal substrate is copper (Cu) or Cu alloy.

Then, as shown in FIG. 5B, the chip modules 520a and 520b are positioned on the first surface 511 of the metal substrate 510. In which, the chips 521a and 522a are stacked to form the chip module 520a, and directly electrically connected to each other. According to one embodiment of the present disclosure, forming the chip module on the first surface of the metal substrate comprises mounting a first chip on the first surface of the metal substrate, and stacking a second chip on the first chip, wherein the second chip is electrically connected with the first chip. According to another embodiment of the present disclosure, forming the chip module on the first surface of the metal substrate comprises providing the chip module comprising at least two stacked chips, and mounting the chip module on the first surface of the metal substrate. And an adhesive layer 523a is sandwiched between the stacked chips 521a and 522a.

The chips 521b and 522b are stacked to form the chip module 520b, and electrically connected to each other through a conductive layer 523b, wherein the conductive layer 523b is a solder or adhesive material. In FIG. 5B, the chip 521b is flip-chip mounted on the metal substrate 510. According to the present invention, the chip 522a can be vertically integrated and electrically connected to the chip 521a before or after mounting the chip 521a on the metal substrate 510.

In one embodiment of the present disclosure, the chip 522a is stacked on the chip 521a after the chip 521a is mounted on the metal substrate 510. In another embodiment of the present disclosure, the chip module 520a is first formed and then mounted on the metal substrate 510. In FIG. 5C, an insulation material layer 530 covers the first surface 511 of the metal substrate 510 and the chip modules 520a and 520b. According to one example of the present disclosure, the material of the insulation material layer includes ABF (Ajinomoto build-up film), BT (bismaleimide-triazine resin), PI (polyimide) or FR4 (glass-epoxy resin).

Figure 5D:
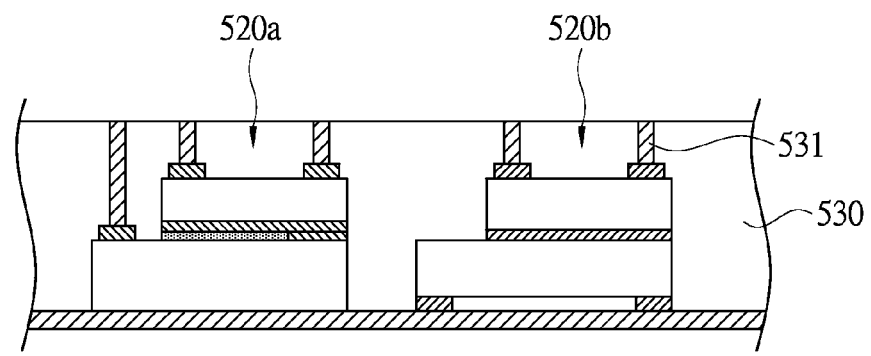

Then, a plurality of vias 531 are formed in the insulation material layer 530, as shown in FIG. 5D. According to one example of the present disclosure, the step of forming the vias comprises performing laser drilling, dry etching or wet etching process to form a plurality of via holes, and then filling a conductive layer into the via holes to form the vias.

Figure 5E:
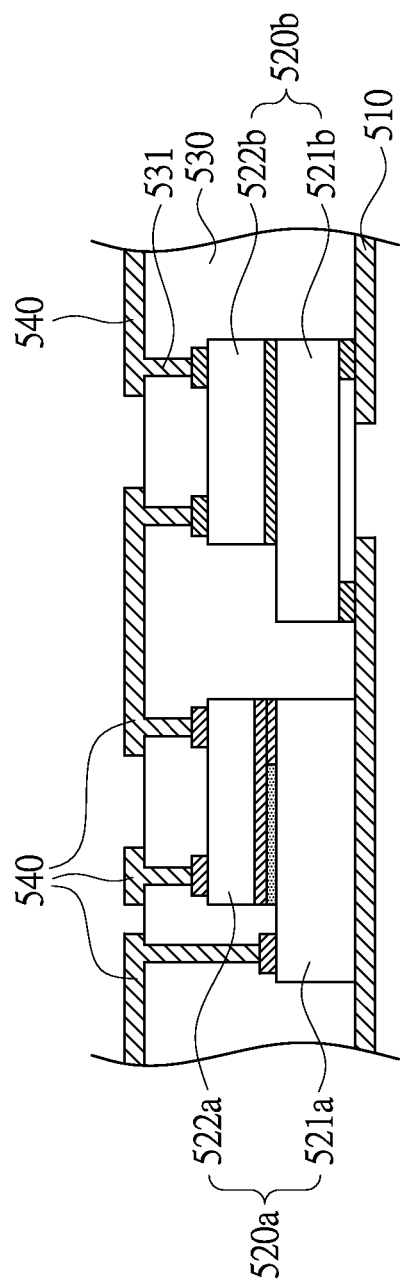

In FIG. 5E, a patterned metal layer 540 is formed on the insulation material layer 530 including the vias 531. According to one example of the present disclosure, the step of forming the patterned metal layer 540 comprises metallization and etching process, wherein the metallization includes physical vapor deposition (PVD), chemical vapor deposition (CVD), atomic layer deposition (ALD) or metal organic chemical vapor deposition (MOCVD); and the etching process is dry etching or wet etching. According to another example of the present disclosure, the metal substrate 510 is patterned by the etching process in the step of forming the patterned metal layer.

The material of the patterned metal layer 540 is selected from the group of copper (Cu), titanium (Ti), platinum (Pt), aluminum (Al), nickel (Ni), tungsten (W), gold (Au), zinc (Zn), tin (Sn), germanium (Ge), or a combination thereof. According to one example of the disclosure, the material of the vias 531 is same as the patterned metal layer 540. According to another example of the disclosure, the material of the vias 531 different to the patterned metal layer 540.

The chip modules 520a and 520b are electrically connected to the patterned metal layer 540 through vias 531, in which the chip 522a of the chip module 520a is electrically connected to the chip 522b of the chip module 520b through the patterned metal layer 540. According to one example of the present disclosure, the stacked chips are laterally disposed to form the chip module, and then the chip module is electrically connected to other chips, stacked chips, chip modules or a combination thereof through the patterned metal layer.

Figure 5F:
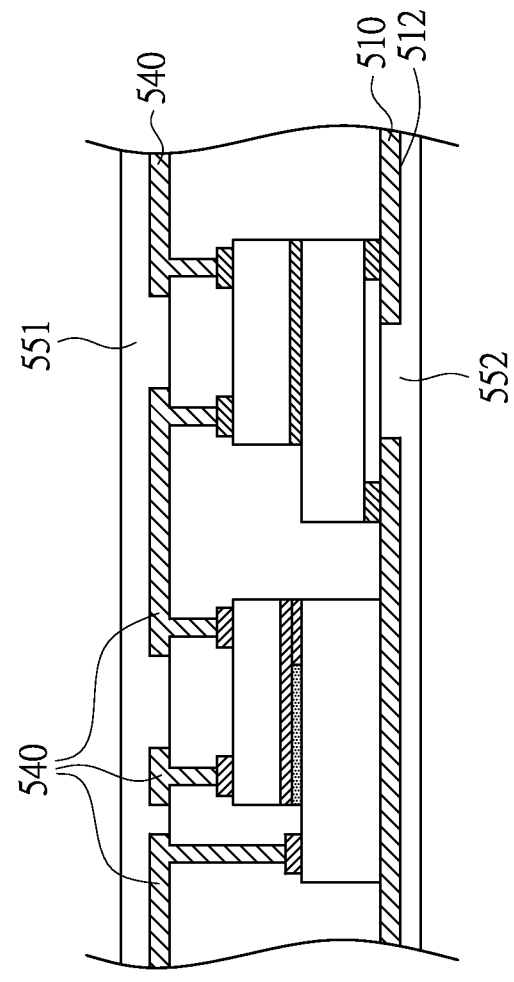

Then, a first passivation layer 551 is formed on the patterned metal layer 540, and a second passivation layer 552 is formed on the second surface 512 of the metal substrate 510. And the embedded package structure 500 is thereby completed as shown in FIG. 5F. According to one example of the present disclosure, the step of forming the first passivation layer and the second passivation layer is deposition or coating. According to one example of the present disclosure, the material of the first passivation layer is epoxy resins, silicon oxides (SiOx) or silicon nitrides (SiNx). According to another example of the present disclosure, the material of the second passivation layer is epoxy resins, silicon oxides (SiOx) or silicon nitrides (SiNx).

The present disclosure provides an improved embedded package structure having at least two stacked chips. In which, the stacked chips are electrically connected to each other directly or through a conductive layer, and forms a chip module in the embedded package structure. Unlike to the conventional embedded package structure, the embedded package structure according to the present disclosure is simplified the design of the redistribution layer thereof, and has a shorter signal transmission distance between chips or chip modules, so as to improve parasitic effects of embedded package structures and shrink the size of the embedded package structure. Otherwise, due to the design of the simplified redistribution layer, the embedded package structure is not only reduced parasitic effects, but also increased the power density and the reliability thereof. The production cost of the embedded package structure according to the present disclosure is relatively lower than the conventional embedded package structure.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. An embedded package structure comprising:
   a metal substrate having a first surface and a second surface;
   a chip module, disposed on the first surface of the metal substrate, comprising at least two stacked chips being electrically connected to each other;
   an insulation material layer covering the first surface of the metal substrate and the chip module and having an electrical interconnection formed therein; and
   at least one patterned metal layer, positioned on the insulation material layer, electrically connected the chip module through the electrical interconnection.

2. The embedded package structure of claim 1, further comprising another chip module disposed on the first surface of the metal substrate.

3. The embedded package structure of claim 1, wherein at least one of the chips is of vertical type or lateral type.

4. The embedded package structure of claim 1, further comprising an adhesive layer or a solder positioned between the stacked chips.

5. The embedded package structure of claim 1, wherein the stacked chips are electrically connected to each other through a conductive layer.

6. The embedded package structure of claim 1, wherein the material of the insulation material layer comprises ABF (Ajinomoto build-up film), BT (bismaleimide-triazine resin), PI (polyimide) or FR4 (glass-epoxy resin).

7. The embedded package structure of claim 1, wherein the material of the patterned metal layer is selected from the group consisting of copper (Cu), titanium (Ti), platinum (Pt), aluminum (Al), nickel (Ni), tungsten (W), gold (Au), zinc (Zn), tin (Sn), germanium (Ge), and a combination thereof.

8. The embedded package structure of claim 1, further comprising a first passivation layer covering the patterned metal layer.

9. The embedded package structure of claim 8, further comprising a second passivation layer covering the second surface of the metal substrate.

10. A method for manufacturing an embedded package structure, comprising the steps of:
    providing a metal substrate having a first surface and a second surface;
    forming a chip module disposed on the first surface of the metal substrate, wherein the chip module comprises at least two stacked chips electrically connected to each other;
    forming an insulation material layer covering the first surface of the metal substrate and the chip module;
    forming a plurality of vias through the insulation material layer; and
    forming at least one patterned metal layer on the insulation material layer, wherein the vias electrically connect the chip module and the patterned metal layer.

11. The method of claim 10, wherein the material of the metal substrate is copper (Cu) and Cu alloy.

12. The method of claim 10, further comprising forming an adhesive layer or a solder between the stacked chips.

13. The method of claim 10, wherein the material of the insulation material layer comprises ABF (Ajinomoto build-up film), BT (bismaleimide-triazine resin), PI (polyimide) or FR4 (glass-epoxy resin).

14. The method of claim 10, wherein forming the vias comprises performing a laser drilling, dry etching, or wet etching process to form a plurality of via holes.

15. The method of claim 10, wherein forming the patterned metal layer comprises metallization and etching process.

16. The method of claim 15, wherein the metallization comprises physical vapor deposition (PVD), chemical vapor deposition (CVD), atomic layer deposition (ALD) or metal organic chemical vapor deposition (MOCVD).

17. The method of claim 15, wherein the etching process comprises dry etching or wet etching.

18. The method of claim 10, further comprising forming another chip module disposed on the first surface of the metal substrate.

19. The method of claim 10, wherein forming the chip module on the first surface of the metal substrate comprises:
   mounting a first chip on the first surface of the metal substrate; and
   stacking a second chip on the first chip, wherein the second chip is electrically connected with the first chip.

20. The method of claim 10, wherein forming the chip module on the first surface of the metal substrate comprises:
   providing the chip module comprising at least two stacked chips; and
   mounting the chip module on the first surface of the metal substrate.

\* \* \* \* \*